United States Patent
Oomori et al.

(10) Patent No.: US 7,263,112 B2
(45) Date of Patent: Aug. 28, 2007

(54) OPTICAL MODULE INCLUDING A PELTIER DEVICE THEREIN AND HAVING A CO-AXIAL TYPE PACKAGE

(75) Inventors: Hirotaka Oomori, Kanagawa (JP); Kenichiro Uchida, Kanagawa (JP); Shigeo Hayashi, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 65 days.

(21) Appl. No.: 10/858,403

(22) Filed: Jun. 2, 2004

(65) Prior Publication Data
US 2005/0008049 A1 Jan. 13, 2005

(30) Foreign Application Priority Data
Jun. 3, 2003 (JP) .............................. 2003-158154

(51) Int. Cl.
*H01S 3/04* (2006.01)
*H01L 29/22* (2006.01)

(52) U.S. Cl. .......................................... 372/36; 257/99
(58) Field of Classification Search .................. 372/36; 257/99
See application file for complete search history.

(56) References Cited

U.S. PATENT DOCUMENTS

| | | | | |
|---|---|---|---|---|
| 4,338,577 A | * | 7/1982 | Sato et al. ..................... | 372/36 |
| 6,556,608 B1 | * | 4/2003 | Gilliland et al. ........... | 372/50.1 |
| 6,807,218 B1 | * | 10/2004 | Greenwood et al. ........ | 372/107 |
| 6,920,162 B2 | * | 7/2005 | Harding ....................... | 372/36 |
| 2003/0043868 A1 | | 3/2003 | Stewart et al. | |
| 2005/0207459 A1 | * | 9/2005 | Yu et al. ....................... | 372/36 |

FOREIGN PATENT DOCUMENTS

| | | |
|---|---|---|
| JP | 5-95169 | 4/1993 |
| JP | 11-186668 | 7/1999 |
| JP | 11-295559 | 10/1999 |

* cited by examiner

*Primary Examiner*—Minsun Harvey
*Assistant Examiner*—Marcia A. Golub
(74) *Attorney, Agent, or Firm*—McDermott Will & Emery LLP

(57) ABSTRACT

The present invention provides an optical module able to reduce the power consumption thereof. The optical module, the package of which has a type of CAN or a co-axial shape, includes a Peltier device, a block, a laser diode (LD) and a photodiode. The block, mounting the LD on the side surface thereof, has a surface for reflecting the light emitted from the light-reflecting facet of the LD, and is mounted on the Peltier device. The photodiode, installed outside the Peltier device, receives the light emitted from the LD and reflected by the surface of the block. Since the photodiode is mounted outside the Peltier device, the cooling efficiency of the Peltier device may be enhanced, which saves the power consumption of the optical module.

8 Claims, 2 Drawing Sheets

OPTICAL MODULE INCLUDING A PELTIER DEVICE THEREIN AND HAVING A CO-AXIAL TYPE PACKAGE

BACKGROUND OF THE INVENTION

1. Field of the Invention

The present invention relates to an optical module, in particular, a light-emitting module including a Peltier device therein and having a co-axial type package.

2. Related Prior Art

It is well known that a light-emitting module, which installs a semiconductor laser diode for the light-emitting device therein, contains a thermoelectric device, such as Peltier device, for controlling a temperature of the laser diode (hereinafter denoted by LD). In such optical module, the LD is mounted on the Peltier device, and the Peltier device, supplied by the current, controls the temperature of the LD.

However, the optical module having a package of, so called the CAN type or the co-axial type, has various subjects when installs the Peltier device therein. That is, such package, 1) extremely restricts the device mounting area generally called as a stem, 2) shows an inferior heat dissipation efficiency because paths for heat dissipation is restricted to the stem, and 3) the optical axis of the output light makes a right angle to the device mounting area that restricts the arrangement of the device installing.

SUMMARY OF THE INVENTION

According to one feature of the present invention, an optical module, comprising a laser diode (LD), a Peltier device, a block, and a photodiode, is provided. The Peltier device mounts the LD via a chip carrier thereon. The block is mounted on the Peltier device, and may include a device mounting portion and a light-reflecting portion. The LD is mounted on the device-mounting portion of the block via a chip carrier. The light-reflecting portion includes a surface for reflecting the light emitted from the LD to the photodiode. In the present invention, the photodiode is mounted outside the Peltier device.

Since the cooling efficiency of the Peltier device fully depends on the number of the bonding wire to be connected to devices mounted on the Peltier device, and the photodiode is mounted outside the Peltier device, the power consumption of the Peltier device may be reduced.

Moreover, since the block has both functions to mount the LD and to reflect light emitted from the LD, the form factor to install the reflecting member and the mounting member may be reduced. This is particularly effectual in the optical module having the co-axial type package. In the arrangement of the present invention, the optical axis of the LD, which connects the light-transmitting facet to the light-reflecting facet of the LD, is perpendicular to the optical axis of the PD.

The optical module in the present invention may further include a package having a stem and a cover. The stem, having a disk shape, mounts the Peltier device and the photodiode thereon. The stem may further include lead pin having a flat tip portion. The photodiode may be installed on the flat portion of the lead pin. Thus, the form factor to install devices may be further reduced.

The LD may be mounted on the side surface of the block such that the optical axis thereof directs to a direction perpendicular to the stem, and the optical axis of the photodiode is in parallel to the stem. Thus, the light emitted from the light-reflecting facet of the LD is reflected by the surface of the block and enters the photodiode.

DETAILED DESCRIPTION OF PREFERRED EMBODIMENT

Figure 1:
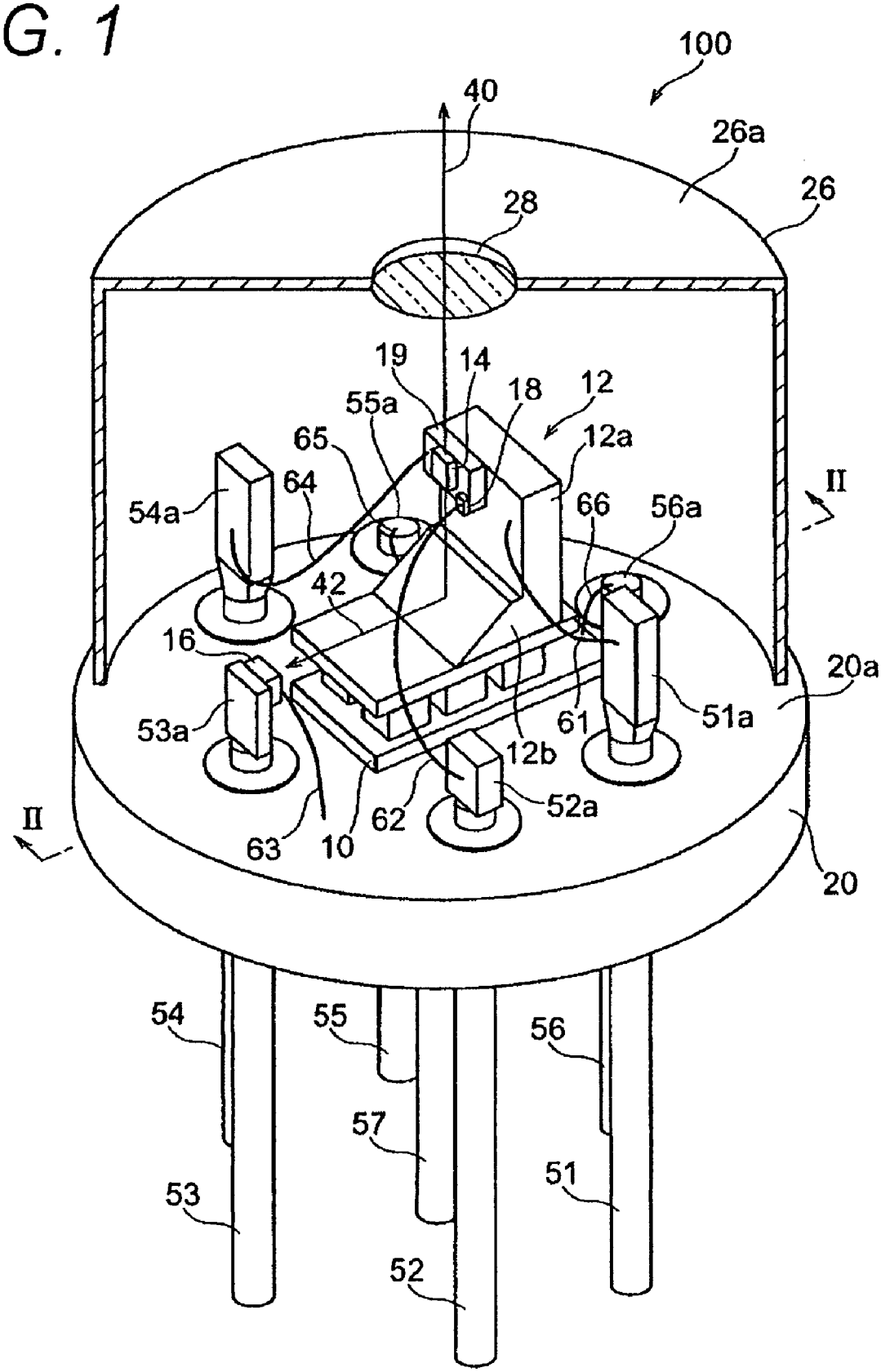
FIG. 1 is a partially cutaway perspective view of an optical module according to the present invention.

Next, preferred embodiments according to the present invention will be described as referring to accompanying drawings. In the drawings and their explanations, same symbols and numerals will be referred to same elements without overlapping explanations.

Figure 2:
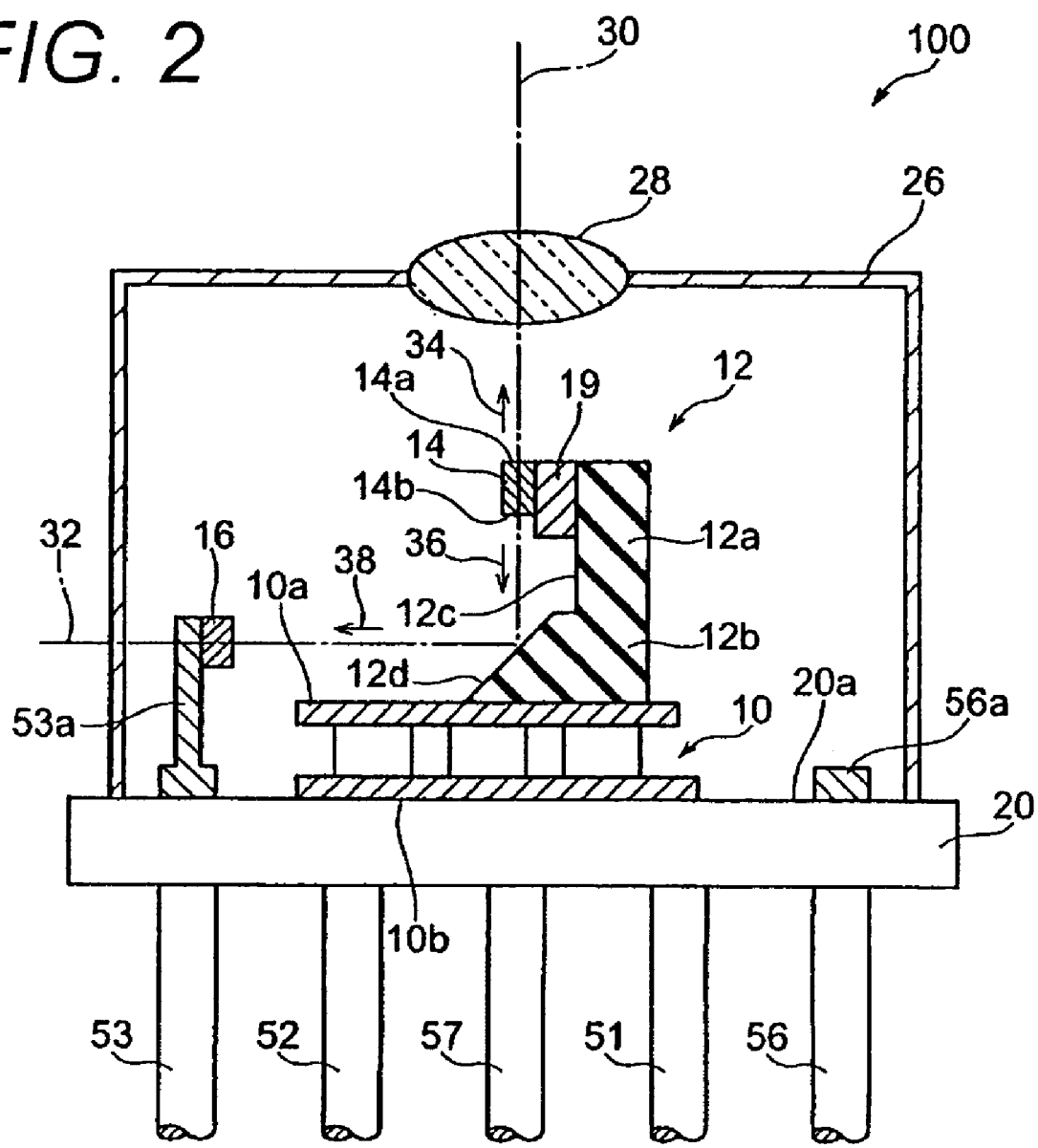
FIG. 2 is a cross sectional view taken along the ling II-II in FIG. 1.

FIG. 1 is a perspective view partially cutaway view of the optical module 100 to show the inside thereof, and FIG. 2 is a sectional view taken along the line II-II in FIG. 1. The optical module 100 has a package type called as a CAN-type or a co-axial type, and contains a Peltier device 10, a block 12, a laser diode, hereinafter denoted as LD, and a photodiode 16 in the package.

The Peltier device 10 is a thermoelectric device to control a temperature of the LD 14. The Peltier device 10 has an upper surface 10a and a lower surface 10b, one of which absorbs heat and the other emits heat depending on the current supplied to the Peltier device, which enables the LD to be heated up or cooled downs.

The block 12, which is made of electrically conductive material in this embodiment, is an optical member for mounting the LD thereon. The block 12 is mounted on the upper surface 10a of the Peltier device. As illustrated in FIG. 2, the block 12 includes a device-mounting portion 12a, which is substantially quadrangular, and a light-reflecting portion 12b having a trapezoidal cross section.

A chip carrier 19 is disposed on the side surface 12c of the device-mounting portion 12a, and the LD 14 is mounted on the chip carrier 19. The LD 14 has a front facet passing through the light and a light-reflecting facet reflecting the light. A thermistor, which monitors the temperature of the LD, is disposed in the vicinity of the LD and on the chip carrier.

The light-reflecting portion 12b of the block 12 includes a surface 12d for reflecting light emitted from the LD 14. The surface 12d is inclined to both the upper surface 10a of the Peltier device 10 and the side surface 12c of the device-mounting portion 12a. The light-reflecting portion 12b may be formed by coating the surface thereof.

The Peltier device 10 is mounted on the stem 20 of the package. The stem has a disk shape and is made of iron or an alloy metal of copper and tungsten (CuW). The primary surface 20a of the stem 20 is in contact with the lower surface 10b of the Peltier device 10. A plurality of lead pins 51 to 57 passes through the stem 20. The tips of the lead pins 51 to 54 are formed in flat. Other tips 55a and 56a of the lead pins 55 and 56 are cylindrical. These tips 51a to 56a of the lead pins 51 to 56 protrude from the primary surface 20a of the stem 20.

The photodiode 16 monitors the magnitude of the optical output of the LD 14. The photodiode 16 is mounted on the flat portion 53a of the lead pin 53, accordingly, electrically connected thereto. The photodiode 16 is mounted on the flat portion 53a such that the light-receiving surface thereof faces to the surface 12d of the block 12, namely, the photodiode is disposed such that the optical axis thereof makes a right angle to that of the LD 14. Thus mounted photodiode receives the light emitted from the LD 14 and sends an electrical signal corresponding to the magnitude of the received light to the lead pin 53.

Between the device-mounting portion 12a of the block 12 and the flat portion 51a of the lead pin 51 is connected by the bonding wire 61. Another bonding wire connects the thermistor 18 and the flat portion 52a of the lead pin 52. The output from the thermistor 18 is sent to the lead pin 52 via the bonding wire 62. The photodiode 19 is connected to the stem 20, the chip carrier 19 is connected to the lead pin 54, and the Peltier device 10 is connected to the lead pins 55 and 56 by the bonding wire 63, 64, 65 and 66, respectively. The Peltier device 10 is driven by the current supplied from the lead pins 55 and 56 via the bonding wires 65 and 66.

The tip portions 51a, 52a and 54a of respective lead pins protrude from the primary surface 20a of the stem 20 enough length to shorten the length of bonding wires 61, 62 and 64 to be connect to the LD 14, the thermistor 18 and chip carrier 19 in spite of the levels of these devices from the primary surface 20a. Moreover, since the tip portions of these lead pins 51, 52, and 54 are formed in flat, the wire bonding thereto may be facilitated.

A cap is provided on the stem 20 to cover the Peltier device 10, the block 12, the LD 14, and the photodiode. The cap is also made of iron. On the top of the cap 26 is provided a lens 28, which concentrates the light emitted from the LD 14.

As illustrated in FIG. 2, the optical axis 30 of the lens 28 coincides with that of the LD 14. The optical axis 30 makes a right angle to the primary surface 20a of the stem 20 and the upper surface 10a of the Peltier device 10. The side surface 12c of the block 12 is in parallel to the optical axis 30, and the surface, by which the light from the LD 14 to the photodiode 16 is reflected, is inclined by substantially 45° to the side surface 12c, namely, to the optical axis 30.

The light 40 emitted from the front facet 14a of the LD 14 transmits upward along the arrow 34, axis illustrated in FIG. 1, in parallel to the optical, enters the lens 28, is concentrated thereby, and outputs from the module 100.

On the other hand, the light emitted from the rear face 14b of the LD 14 transmits downward along the arrow 36 in parallel to the optical axis 30, and enters the surface 12d. Since the surface 12d is inclined by substantially 45° to the optical axis 30, the surface 12d changes the direction of the light in a right angle. Therefore, the light reflected by the surface 12d advances along the arrow 38 to the photodiode 16. The optical axis 32 of the photodiode 16 makes a right angle to that of the LD 14, and is parallel to the primary surface 20a of the stem 20 and the upper surface 10a of the Peltier device 10. Therefore, The reflected light 42 advances in parallel to the optical axis 32, the primary surface 20a of the stem 20, and the upper surface 10a of the Peltier device 10, and finally enters the photodiode 16. The photodiode 16 generates the electrical signal depending on the magnitude of the received light. The signal is output to the outside via the lead pin 53.

In the present arrangement of the optical module 100, the power consumption thereof can be reduced, because the cooling efficiency of the Peltier device may be enhanced. Generally, almost all the power supplied to the Peltier device is consumed to the electrical-to-thermal conversion. The cooling efficiency of the Peltier device fully depends on the number of the bonding wire connected to the devices mounted thereon. The many the wire, the greater the quantity of heat conveyed from the outside to the vicinity of the LD 14 via the bonding wires, which increases the electrical power supplied to the Peltier device to cool down the devices mounted thereon. Thus, to enhance the cooling efficiency of the Peltier device, it is preferable to decrease the wires connected thereto.

In the present embodiment, the photodiode is disposed outside the Peltier device 10, which reduces the bonding wires to be connected to the devices mounted thereon and, as a result, enhances the cooling efficiency of the Peltier device 10. The optical module 100 can be operated in lower power consumption.

The second advantage of the present invention is to miniaturize the optical module 100. The block 12 of the optical module 100 has both functions to mount the LD 14 and to reflect the light emitted from the LD 14. Therefore, the form factor to install the reflecting member and the mounting member can be reduced, which is, in particular, effectual in the optical module having the CAN type or the co-axial type package.

While the invention has been described in connection with a preferred embodiment, it is not intended to limit the scope of the invention to the particular form set forth, but on the contrary, it is intended to cover such alternatives, modifications, and equivalents as may be within the spirit and scope of the invention as defined by the appended claims.

What is claimed is:

1. An optical module, comprising:
   a laser diode for emitting light, said laser diode having a light-transmitting facet and a light-reflecting facet opposite to said light-transmitting facet, said laser diode having a first optical axis connecting said light-emitting facet to said light-reflecting facet;
   a Peltier device having upper and lower surfaces, said Peltier device controlling a temperature of said laser diode;
   a block, mounted on said upper surface of said Peltier device, said block having a device mounting portion and a light-reflecting portion, said device mounting portion mounting said laser diode thereon and said light-reflecting portion including a surface for reflecting said light emitted from said light-reflecting facet of said laser diode;
   a semiconductor photodiode for monitoring said light emitted from said laser diode and reflected by said block, said photodiode having a second optical axis different from and not parallel to said first optical axis of said laser diode; and
   a CAN package for enclosing said laser diode, said block, said Peltier device, and said photodiode therein, said CAN package including a disk-shaped stem facing said lower surface of said Peltier device and mounting said Peltier device thereon,
   wherein said photodiode is mounted outside of said Peltier device so as to be thermally isolated from said upper surface of said Peltier device.

2. The optical module according to claim 1, wherein said surface of said block is inclined by substantially 45° to said first optical axis and to said second optical axis, and
   said first optical axis is substantially perpendicular to said stem and said second optical axis is substantially parallel to said stem.

3. The optical module according to claim 1, wherein said block further mounts a thermistor in a vicinity of said laser diode for monitoring said temperature of said laser diode.

4. The optical module according to claim 1, wherein said package further includes a lead pin passing through said stem, a tip portion of said lead pin has a flat portion for mounting said photodiode thereon, and said second optical axis connecting said photodiode to said surface of said block is substantially in parallel to said stem.

5. A light-emitting module having a co-axial package including a stem and an axis substantially perpendicular to said stem, said module transmitting light to a direction in parallel to said axis, said module comprising:

a semiconductor light-emitting device having a light-transmitting facets, a light-reflecting facet opposite to said light-transmitting facet and a first optical axis connecting said light-emitting facet to said light-reflecting facet, said first optical axis being substantially parallel to said axis of said co-axial package, said light-emitting device emitting said light from both said light-emitting facet and said light-reflecting facet in a direction along said first optical axis;

a thermoelectric device having upper and lower surfaces, said lower surface facing and being attached to said stem, said thermoelectric device controlling a temperature of said semiconductor light-emitting device;

a block mounted on said upper surface of said thermoelectric device, said block providing a device-mounting portion for mounting said semiconductor light-emitting device thereon and a light-reflecting portion having a surface for reflecting light emitted from said light-reflecting facet of said semiconductor light-emitting device; and a semiconductor light-receiving device for monitoring said light emitted from said light-reflecting facet of said semiconductor light-emitting device and reflected by said surface of said block, said semiconductor light-receiving device having a second optical axis connecting said semiconductor light-receiving device to said surface of said block, wherein said co-axial package encloses said semiconductor light-emitting device, said thermoelectric device, said block, and said semiconductor light-receiving device therein, and said semiconductor light-receiving device is mounted outside of said thermoelectric device so as to be thermally isolated from said upper surface of said thermoelectric device.

6. The light-emitting module according to claim 5, wherein said package further includes a lead pin having a flat tip portion, said semiconductor light-receiving device being mounted on said flat portion of said lead pin.

7. The light-emitting module according to claim 5, wherein said first optical axis of said semiconductor light-emitting device is substantially perpendicular to said stem, said second optical axis of said semiconductor light-receiving device is substantially in parallel to said stem, and said surface of said block is inclined by substantially 45° to said first optical axis and to said second optical axis.

8. The light-emitting module according to claim 5, wherein said block further mounts a thermistor in a vicinity of said laser diode on said device-mounting portion for monitoring a temperature of said laser diode.

* * * * *